(12) United States Patent
Kido

(10) Patent No.: US 9,854,189 B2
(45) Date of Patent: Dec. 26, 2017

(54) IMAGING ELEMENT AND ELECTRONIC APPARATUS WITH IMPROVED WIRING LAYER CONFIGURATION

(71) Applicant: Sony Corporation, Tokyo (JP)

(72) Inventor: Hideo Kido, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 67 days.

(21) Appl. No.: 14/338,886

(22) Filed: Jul. 23, 2014

(65) Prior Publication Data

US 2015/0036030 A1 Feb. 5, 2015

(30) Foreign Application Priority Data

Jul. 30, 2013 (JP) ................................ 2013-157935

(51) Int. Cl.
| | |
|---|---|
| *H04N 5/369* | (2011.01) |
| *H04N 5/374* | (2011.01) |
| *H04N 5/335* | (2011.01) |
| *H01L 27/146* | (2006.01) |
| *H04N 5/33* | (2006.01) |

(52) U.S. Cl.
CPC ......... *H04N 5/369* (2013.01); *H01L 27/1464* (2013.01); *H01L 27/14636* (2013.01); *H04N 5/332* (2013.01); *H04N 5/335* (2013.01); *H04N 5/374* (2013.01)

(58) Field of Classification Search
None
See application file for complete search history.

(56) References Cited

U.S. PATENT DOCUMENTS

| | | | | |
|---|---|---|---|---|
| 2004/0005729 | A1* | 1/2004 | Abe et al. ........................ | 438/48 |
| 2006/0249653 | A1* | 11/2006 | Gazeley ..................... | 250/208.1 |
| 2006/0249654 | A1* | 11/2006 | Silsby et al. ............... | 250/208.1 |
| 2010/0002117 | A1* | 1/2010 | Iwane et al. .................. | 348/308 |
| 2010/0097486 | A1* | 4/2010 | Iwane ........................ | 348/222.1 |
| 2010/0177226 | A1* | 7/2010 | Itonaga et al. ............... | 348/300 |
| 2011/0037134 | A1* | 2/2011 | Sugino et al. ............... | 257/432 |
| 2011/0157445 | A1* | 6/2011 | Itonaga et al. ............... | 348/308 |
| 2014/0084410 | A1* | 3/2014 | Okigawa ....................... | 257/447 |
| 2015/0097998 | A1* | 4/2015 | Kato et al. .................... | 348/308 |

FOREIGN PATENT DOCUMENTS

| | | |
|---|---|---|
| CN | 101794800 | 8/2010 |
| JP | 2009-238985 A | 10/2009 |

OTHER PUBLICATIONS

Official Action (with English translation) for Chinese Patent Application No. 201410352991.X dated Apr. 5, 2017, 17 pages.

* cited by examiner

*Primary Examiner* — Shahbaz Nazrul
(74) *Attorney, Agent, or Firm* — Sheridan Ross P.C.

(57) ABSTRACT

An imaging element includes a photoelectric conversion section and a wiring layer. The photoelectric conversion section is configured to photoelectrically convert light incident from a subject. The wiring layer is provided on an opposite side of the subject with respect to the photoelectric conversion section and includes a wire connected to an element that constitutes a pixel including the photoelectric conversion section. The wire includes a plurality of wires extending long in a predetermined direction. The plurality of wires are arranged in a direction almost perpendicular to the predetermined direction in the wiring layer. The wire is provided with a protrusion protruding in a direction different from the predetermined direction.

19 Claims, 11 Drawing Sheets

FIG.3

IMAGING ELEMENT AND ELECTRONIC APPARATUS WITH IMPROVED WIRING LAYER CONFIGURATION

CROSS REFERENCE TO RELATED APPLICATIONS

This application claims the benefit of Japanese Priority Patent Application JP 2013-157935 filed Jul. 30, 2013, the entire contents of which are incorporated herein by reference.

BACKGROUND

The present disclosure relates to an imaging element and an electronic apparatus and more particularly to an imaging element and an electronic apparatus, by which a higher-quality image can be provided.

In related art, there is known a back-illuminated solid-state imaging element including on-chip lenses that collect light from a subject, a wiring layer in which wires of transistors and the like that drive pixels, and photodiodes that receives the light from the subject, the photodiodes being provided between the on-chip lenses and the wiring layer.

In the back-illuminated solid-state imaging element, the transistor wires and the like are not provided between the lenses that collect light and the photodiode that receives the light. Therefore, pixel openings can be made larger for receiving more light. Thus, it is possible to provide a high-quality image.

As the back-illuminated solid-state imaging element, there is one including a reflective film on a side of the wiring layer provided sandwiching a photodiode with respect to a back side on which light enters, that is, a front side for positively reflecting light passing through the photodiode (e.g., see Japanese Patent Application Laid-open No. 2009-238985 (hereinafter, referred to as Patent Document 1)).

In this solid-state imaging element, light passing through the photodiode out of light that has entered the photodiode from the back side is reflected by a reflective film provided in vicinity of the photodiode and enters the photodiode again. Therefore, the photodiode can receive more light. It is possible to achieve a high sensitivity in a near infrared area.

SUMMARY

However, it is difficult for the above-mentioned technique to provide a high-quality image.

For example, in the back-illuminated solid-state imaging element in the related art, control wires for elements are provided in the wiring layer on the front side. Some of the control wires have a wiring pattern in which the control wires are long in one direction without being branched due to connection to the transistors of pixels arranged in a predetermined direction or the like. In the wiring layer in which such control wires are provided, the control wires long in the predetermined direction are arranged at equal intervals in a direction perpendicular to a long-side direction of the control wires.

With such a structure, light incident from the back side passes through the photodiode. The light also passes through the wiring layer including the control wires long in one direction. The light is reflected by another wiring layer. The reflected light enters again the wiring layer including the control wires long in the one direction. Then, the control wires serve as a diffraction grating and diffraction and interference are caused. The light beams mutually intensified due to this interference are spread in a direction perpendicular to the long-side direction of the control wire long in the one direction and enter the photodiode again. Therefore, variations in incident light amount of the reflected light are caused over photodiodes, that is, over pixels. Thus, an output difference between pixel signals of the pixels increases and lateral fringes and the like are generated in an image obtained by imaging, which deteriorates the image quality.

Regarding the solid-state imaging element described in Patent Document 1, it is assumed that light beams that pass through the photodiode and reach the reflective film are incident at different angles. A direction in which the incident light beams are reflected at the reflective film changes depending on a distance from the photodiode to the reflective film and the position of the reflective film in a plane. Therefore, in order to provide a greater effect, it is necessary to provide the reflective film in vicinity of the photodiode.

However, it is actually difficult to control such a light-reflected direction at the reflective film to be an appropriate direction. Due to some positions of the reflective film, there is a possibility that the light-reflected direction is deviated to one direction. Thus, variations in incident light amount of the light from the reflective film are caused over the pixels, which deteriorates the quality of the image obtained by imaging.

In addition, in the solid-state imaging element described in Patent Document 1, it is necessary to form the reflective film in vicinity of the photodiode. However, if the reflective film is provided in vicinity of the photodiode, a coupling capacitance with a gate of an amplifying transistor for driving a pixel and a wire connected to a floating diffusion region, which are provided in vicinity of the photodiode, increase.

Thus, an efficiency of converting electrons (charges) into a voltage obtained by photoelectric conversion in each pixel is lowered. Therefore, a signal to noise ratio (SN ratio) of the pixel signals is lowered and the quality of the resulting image is deteriorated.

In view of the above-mentioned circumstances, it is desirable to provide a higher-quality image.

According to a first embodiment of the present disclosure, there is provided an imaging element including: a photoelectric conversion section configured to photoelectrically convert light incident from a subject; and a wiring layer that is provided on an opposite side of the subject with respect to the photoelectric conversion section and includes a wire connected to an element that constitutes a pixel including the photoelectric conversion section, the wire including a plurality of wires extending long in a predetermined direction, the plurality of wires being arranged in a direction almost perpendicular to the predetermined direction in the wiring layer, the wire being provided with a protrusion protruding in a direction different from the predetermined direction.

The protrusion of the wire may include a plurality of protrusions.

The protrusion may be an additional wire added to the wire to protrude toward another wire adjacent to the wire.

The wire may be provided with the additional wire protruding toward the other wire adjacent in a first direction of the wire, and the additional wire protruding toward the other wire adjacent in a second direction opposite to the first direction of the wire.

The wire may be provided with the additional wire protruding toward the other wire adjacent in the first direction, and the additional wire protruding toward the other wire adjacent in the second direction, the additional wires being alternately arranged in the predetermined direction.

The wire may be provided with the additional wire protruding toward the other wire adjacent in the first direction, and the additional wire protruding toward the other wire adjacent in the second direction, the additional wires being provided at the same position in the predetermined direction.

The protrusion may be formed by changing an extending direction of a part of the wire such that the part of the wire protrudes toward the other wire adjacent to the wire.

The protrusion may have one of a rectangular shape and a triangle shape.

The protrusions of the wires may be provided at the same position in the predetermined direction.

The protrusions of the wires adjacent to each other may be provided at different positions in the predetermined direction.

The imaging element may include a pixel in a predetermined color having a highest transmittance of the light and pixels in a color different from the predetermined color, the pixels being arranged on upper, lower, left, and right sides of the pixel.

As the wiring layer is viewed in a direction perpendicular to a light reception surface of the imaging element, the plurality of wires and one of the entire protrusion of the wire and a part of the protrusion may be included in a region of the wiring layer, the region overlapping with the photoelectric conversion section in the pixel.

In the first embodiment of the present disclosure, in the imaging element including the photoelectric conversion section configured to photoelectrically convert the light incident from the subject, and the wiring layer that is provided on the opposite side of the subject with respect to the photoelectric conversion section and includes the wire connected to the element that constitutes the pixel including the photoelectric conversion section, the wire includes the plurality of wires extending long in the predetermined direction, the plurality of wires are arranged in the direction almost perpendicular to the predetermined direction in the wiring layer, and the wire is provided with the protrusion protruding in the direction different from the predetermined direction.

According to a second embodiment of the present disclosure, there is provided an electronic apparatus including an imaging element including a photoelectric conversion section configured to photoelectrically convert light incident from a subject, and a wiring layer that is provided on an opposite side of the subject with respect to the photoelectric conversion section and includes a wire connected to an element that constitutes a pixel including the photoelectric conversion section, the wire including a plurality of wires extending long in a predetermined direction, the plurality of wires being arranged in a direction almost perpendicular to the predetermined direction in the wiring layer, the wire being provided with a protrusion protruding in a direction different from the predetermined direction.

The protrusion of the wire may include a plurality of protrusions.

The protrusion may be an additional wire added to the wire to protrude toward another wire adjacent to the wire.

The wire may be provided with the additional wire protruding toward the other wire adjacent in a first direction of the wire, and the additional wire protruding toward the other wire adjacent in a second direction opposite to the first direction of the wire.

The protrusion may be formed by changing an extending direction of a part of the wire such that the part of the wire protrudes toward the other wire adjacent to the wire.

The protrusion may have one of a rectangular shape and a triangle shape.

The imaging element may include a pixel in a predetermined color having a highest transmittance of the light and pixels in a color different from the predetermined color, the pixels being arranged on upper, lower, left, and right sides of the pixel.

As the wiring layer is viewed in a direction perpendicular to a light reception surface of the imaging element, the plurality of wires and one of the entire protrusion of the wire and a part of the protrusion may be included in a region of the wiring layer, the region overlapping with the photoelectric conversion section in the pixel.

In the second embodiment of the present disclosure, in the electronic apparatus including the imaging element including the photoelectric conversion section configured to photoelectrically convert the light incident from the subject, and the wiring layer that is provided on the opposite side of the subject with respect to the photoelectric conversion section and includes the wire connected to the element that constitutes the pixel including the photoelectric conversion section, the wire includes the plurality of wires extending long in the predetermined direction, the plurality of wires are arranged in the direction almost perpendicular to the predetermined direction in the wiring layer, and the wire is provided with the protrusion protruding in the direction different from the predetermined direction.

According to the first and second embodiments of the present disclosure, it is possible to provide a higher-quality image.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 3 is a view showing a configuration example of a color filter;

DETAILED DESCRIPTION OF EMBODIMENTS

Hereinafter, embodiments to which the present disclosure is applied will be described with reference to the drawings.
<First Embodiment>
<Configuration Example of Solid-State Imaging Element>

Figure 1:
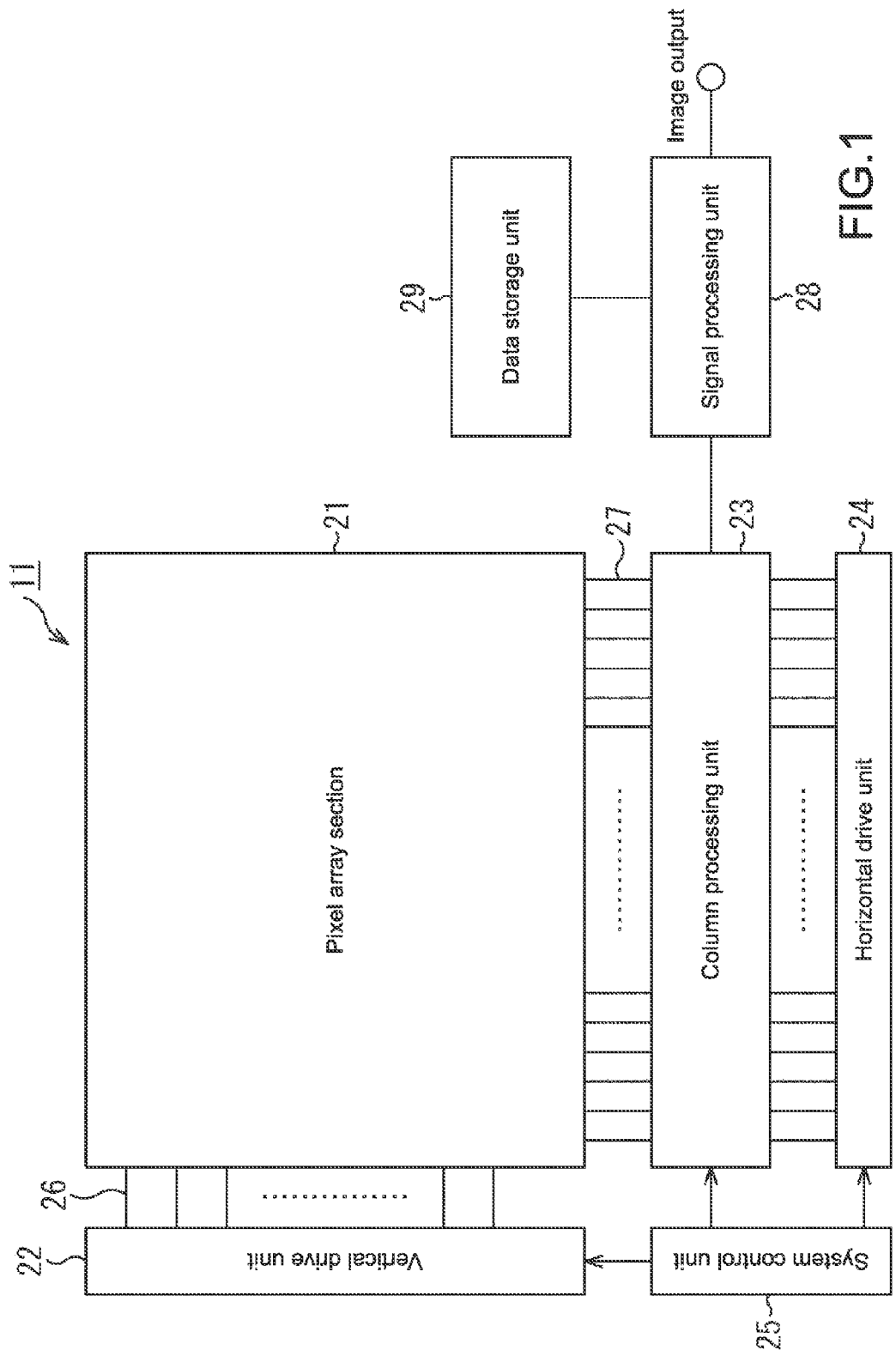
FIG. 1 is a view showing a configuration example of a solid-state imaging element.

A configuration example of a solid-state imaging element to which the present disclosure is applied will be first described. FIG. 1 shows a configuration example of an embodiment of the solid-state imaging element to which the present disclosure is applied.

The solid-state imaging element 11 is a back-illuminated image sensor formed of, for example, a complementary metal oxide semiconductor (CMOS) image sensor. The solid-state imaging element 11 receives and photoelectrically converts light from a subject and generates an image signal, to thereby capture an image.

Note that the back-illuminated image sensor means an image sensor having a configuration in which a photodiode that receives light from a subject is provided between a light reception surface that the light from the subject enters, that is, an on-chip lens that collects light and a wiring layer in which wires of transistors that drive pixels and the like are provided.

The solid-state imaging element 11 includes a pixel array section 21, a vertical drive unit 22, a column processor 23, a horizontal drive unit 24, a system control unit 25, pixel drive lines 26, vertical signal lines 27, a signal processor 28, and a data storage unit 29.

In the solid-state imaging element 11, the pixel array section 21 is formed on a semiconductor substrate (chip) (not shown). In addition, the vertical drive unit 22 to the system control unit 25 are integrated on the semiconductor substrate.

The pixel array section 21 is constituted of pixels each including a photodiode serving as a photoelectric conversion section that generates a charge based on an amount of light incident from the subject and stores the charge. The pixels constituting the pixel array section 21 are two-dimensionally arranged in a horizontal direction (row direction) and a vertical direction (column direction) in the figure.

For example, in the pixel array section 21, the pixel drive lines 26 are arranged along the row direction for each of pixel rows formed of pixels arranged in the row direction. The vertical signal lines 27 are arranged along the column direction for each of pixel columns formed of pixels arranged in the column direction.

The vertical drive unit 22 is formed of a shift register or an address decoder. The vertical drive unit 22 supplies signals or the like to pixels via the plurality of pixel drive lines 26, to thereby drive the pixels of the pixel array section 21 at the same time, on a row-by-row basis, or the like.

The column processor 23 reads out signals from pixels via the vertical signal lines 27 for each pixel column of the pixel array section 21 and performs noise removing, correlation double sampling, analog to digital (A/D) conversion, or the like on the signals to generate pixel signals.

The horizontal drive unit 24 is formed of a shift register or an address decoder. The horizontal drive unit 24 sequentially selects unit circuits corresponding to pixel rows of the column processor 23. This selective scan by the horizontal drive unit 24 sequentially outputs, to the signal processor 28, the pixel signals subjected to signal processing by the column processor 23 for each of the unit circuits.

The system control unit 25 is formed of a timing generator or the like that generates various timing signals. Based on the timing signals generated by the timing generator, the system control unit 25 controls driving of the vertical drive unit 22, the column processor 23, and the horizontal drive unit 24.

The signal processor 28 temporarily stores data in the data storage unit 29 if necessary. At the same time, the signal processor 28 performs signal processing such as computing on the pixel signals supplied from the column processor 23 and outputs image signals formed of the pixel signals of the pixels.
<Configuration Example of Pixel Array Section>

Figure 2:
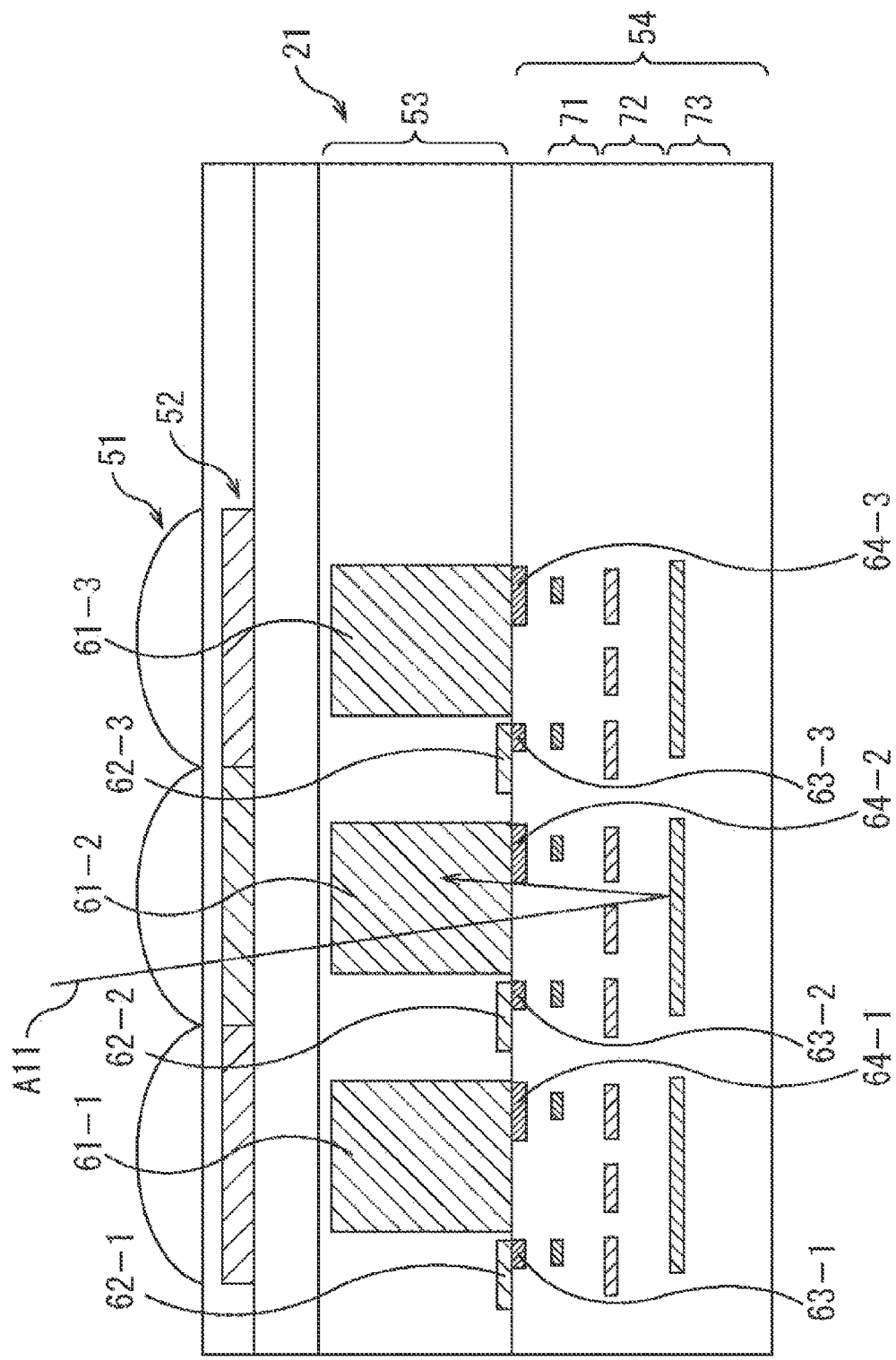
FIG. 2 is a view showing a configuration example of a pixel array section.

The pixel array section 21 shown in FIG. 1 is configured as shown in FIG. 2, for example. Note that FIG. 2 is a cross-sectional view of a partial region of the pixel array section 21.

In this example, an upper side of the pixel array section 21 in the figure is a back side on which the light from the subject enters. A lower side of the pixel array section 21 in the figure is a front side on which the wiring layer is provided.

A lens array 51 is provided in a light reception surface being a surface on the back side of the pixel array section 21. The lens array 51 collects light incident from a subject. A color filter 52 is provided on a lower side of the lens array 51 in the figure. The color filter 52 causes only light having predetermined colors to pass therethrough.

In addition, a Si layer 53 of silicon is provided on a lower side of the color filter 52 in the figure. A wiring layer 54 is provided on a lower side of the Si layer 53 in the figure.

Photodiodes 61-1 to 61-3 that photoelectrically convert incident light and transistors 62-1 to 62-3 for driving the pixels are provided inside the Si layer 53.

Note that, hereinafter, the photodiodes 61-1 to 61-3 will be simply referred to as photodiodes 61 if it is unnecessary to differentiate them from one another. Further, hereinafter, the transistors 62-1 to 62-3 will be simply referred to as transistors 62 if it is unnecessary to differentiate them from one another.

In the pixel array section 21, one photodiode 61 and one transistor 62 are provided for each pixel. The transistor 62 is configured as an amplifying transistor for converting a charge obtained by the photodiode 61 into a voltage and reading out the voltage, for example.

Note that, more specifically, each pixel includes, in addition to the transistor 62, a transfer transistor that transfers a charge obtained by the photodiode 61, a floating diffusion region that stores the transferred charge, a reset transistor that resets the floating diffusion region, and the like.

Further, gates 63-1 to 63-3 of the transistors 62-1 to 62-3 and gates 64-1 to 64-3 of transistors (not shown) for driving the pixels are provided directly below the Si layer 53. The gates 63-1 to 63-3 and the gates 64-1 to 64-3 are made of polysilicon, for example.

Note that, hereinafter, the gates 63-1 to 63-3 will be simply referred to as gates 63 if it is unnecessary to differentiate them from one another and the gates 64-1 to 64-3 will be simply referred to as gates 64 if it is unnecessary to differentiate them from one another.

For example, the gate 64 is a gate of the transfer transistor for transferring a charge obtained by the photodiode 61 to the floating diffusion region. The floating diffusion region temporarily stores the charge transferred from the photodiode 61. The charge in the floating diffusion region is converted into a voltage by the amplifying transistor.

In addition, control wires and the like are provided in the wiring layer 54 formed adjacent to the Si layer 53. The control wires serve to drive the pixels provided in the pixel array section 21 and read out the pixel signals from the pixels. Specifically, for example, wires and the like corresponding to the pixel drive lines 26 and the vertical signal lines 27 shown in FIG. 1 are provided in the wiring layer 54.

In this example, the wiring layer 54 includes three wiring layers 71, 72, and 73. For example, rectangles with hatched lines in the wiring layer 71 indicate wires formed in the wiring layer 71. The wires of the wiring layer 71 are configured as wires that connect the floating diffusion region and the amplifying transistor, the vertical signal lines 27 shown in FIG. 1, and the like.

Further, rectangles with hatched lines in the wiring layer 72 indicate wires formed in the wiring layer 72. For example, the wires of the wiring layer 72 are configured as control wires connected to the gates 63, the gates 64, and the like.

In addition, rectangles with hatched lines in the wiring layer 73 indicate wires formed in the wiring layer 73. For example, the wires of the wiring layer 73 are configured as a wire for driving the pixel array section 21 and other wires.

In the thus configured pixel array section 21, the light from the subject enters the photodiode 61 as indicated by an arrow A11. Specifically, the light from the subject is collected by the lens of each pixel constituting the lens array 51 and enters the photodiode 61 through the color filter 52.

Then, part of the light that has entered the photodiode 61 is received and photoelectrically converted by the photodiode 61. The remaining light of the light that has entered the photodiode 61, which has not been received, passes through the photodiode 61, further passes through the wiring layer 71 and the wiring layer 72, enters the wiring layer 73, and is reflected the wires of the wiring layer 73 as indicated by the arrow A11.

The light reflected by the wiring layer 73 passes through the wiring layer 72 and the wiring layer 71 and enters the photodiode 61 again as indicated by the arrow A11. The light that has thus entered again the photodiode 61 from the wiring layer 73 is received and photoelectrically converted by the photodiode 61.

Now, the color filter 52 provided in the pixel array section 21 is described.

Figure 3:
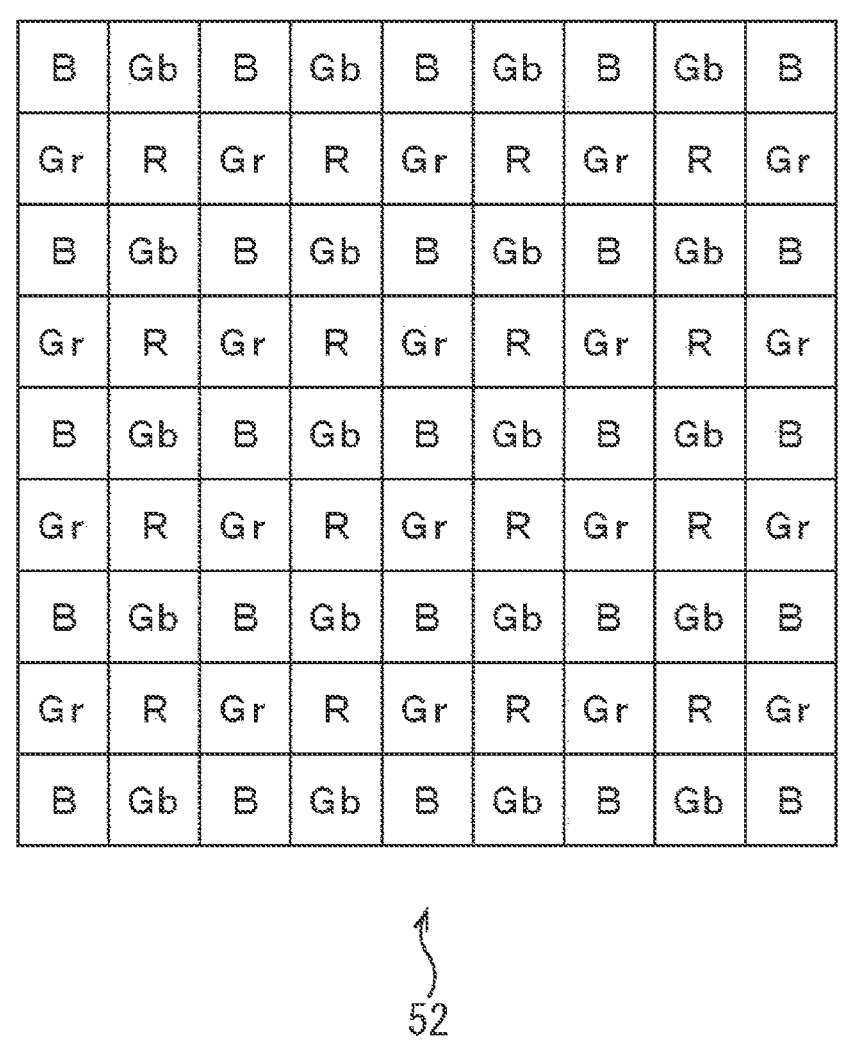

For example, the color filter 52 is set as a filter in which filters of respective colors of red (R), green (Gr, Gb), and blue (B) as shown in FIG. 3 are arranged in the Bayer arrangement.

Note that, in FIG. 3, one square indicates a filter of a certain color provided for one pixel and a letter printed in each square indicates a color of a filter indicated by the square, that is, a color component that the filter causes to pass therethrough.

Specifically, a square with a letter "R" indicates an R filter that causes only an R component of light, that is, red light to pass therethrough. Similarly, a square with a letter "Gr" or "Gb" indicates a Gr filter or a Gb filter that causes only a G component of light, that is, green light to pass therethrough. A square with a letter "B" indicates a B filter that causes only a B component of light, that is, blue light to pass therethrough.

Note that, hereinafter, the pixels provided with the R filter, the Gr filter, the Gb filter, and the B filter, respectively will be also referred to as an R pixel, a Gr pixel, a Gb pixel, and a B pixel.

In the pixel array section 21 provided with the color filter 52 shown in FIG. 3, one R pixel is surrounded by Gb pixels, Gr pixels, and B pixels. The Gb pixels are arranged on the upper and lower sides of the R pixel. The Gr pixels are arranged on left- and right-hand sides of the R pixel. The B pixels are arranged on oblique sides of the R pixel.

<Improvement in Image Quality>

By the way, in the pixel array section 21 that causes R-component light, G-component light, and B-component light to pass therethrough and captures an image, a dominant component of light that passes through the Si layer 53, is reflected by the wiring layer 73, and returns the Si layer 53 is the R component. In other words, among the R-component light, the G-component light, and the B-component light, the R-component light has a highest transmittance through the Si layer 53.

Thus, if, regarding at least the R-component light out of light that enters again the Si layer 53, that is, the photodiode 61, reflected light from the wiring layer 73 is set to evenly enter the pixels, it is possible to suppress deterioration of the image quality due to diffraction and interference of the reflected light.

Figure 4:
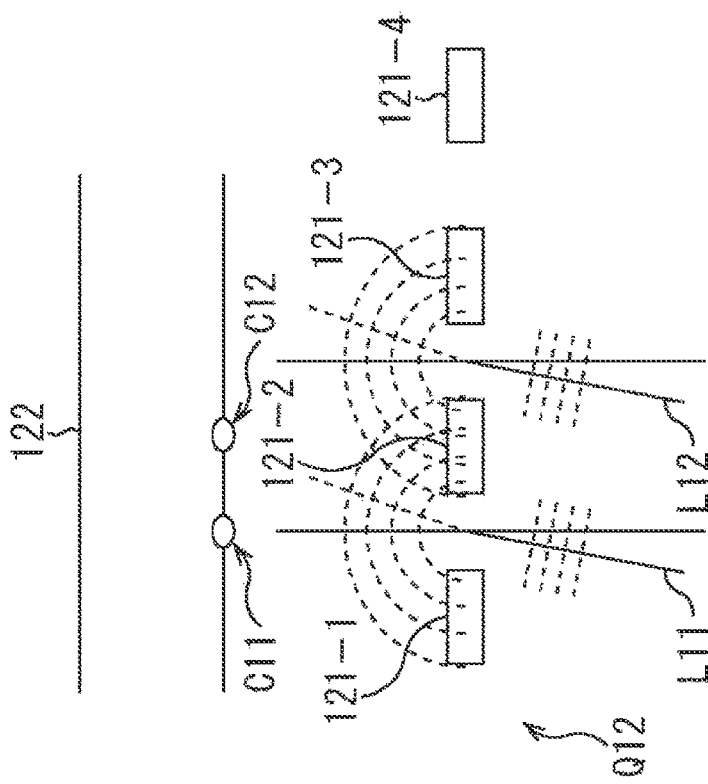
FIG. 4 is a view explaining a wiring pattern in related art and diffraction and interference of reflected light.
Figure 4:
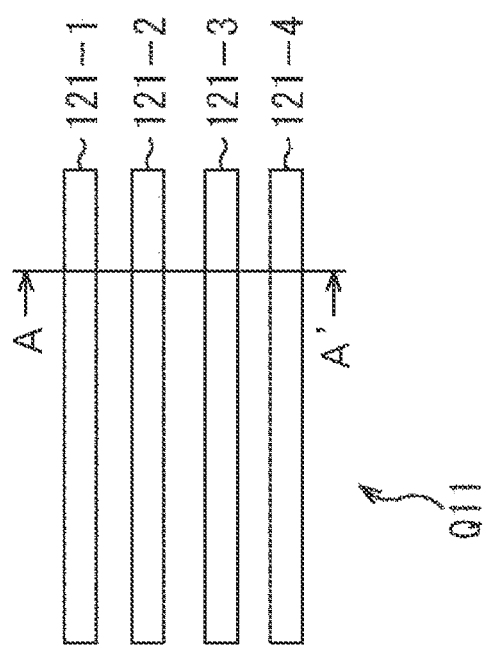

As described above, the back-illuminated solid-state imaging element in the related art has, for example, the wiring pattern of the wire in the wiring layer corresponding to the wiring layer 72 shown in FIG. 2, in which the wires extend long in one direction without being branched as shown in FIG. 4.

That is, in the example indicated by an arrow Q11 in FIG. 4, wires 121-1 to 121-4 long in the horizontal direction in the figure are arranged at equal intervals. Note that, hereinafter, the wires 121-1 to 121-4 will be simply referred to as wires 121 if it is unnecessary to differentiate them from one another.

In this example, each of the wires 121 is a rectangular signal line long in the horizontal direction in the figure. For example, one wire 121 is connected to a gate and the like of a transistor provided in each of the pixels arranged in the horizontal direction in the figure, and hence the wire 121 has a shape long along the arrangement direction of the pixels.

Note that, hereinafter, the direction in which the wire 121 extends long, that is, the horizontal direction in the figure will be also referred to as a long-side direction of the wire 121. Further, a direction perpendicular to the long-side direction, that is, the vertical direction in the figure will be also referred to as a short-side direction of the wire 121.

The plurality of wires 121 long in the one direction are arranged in the short-side direction within the wiring layer. In other words, slits long in the long-side direction of the wire 121 are arranged at equal intervals in this wiring layer.

When reflected light on the front side of the solid-state imaging element, for example, from the wiring layer corresponding to the wiring layer 73 shown in FIG. 2, enters the wiring layer in which the wires 121 are provided, the wires 121 serve as a diffraction grating and diffraction and interference are caused in vicinity of the wires 121 as indicated by an arrow Q12.

The diagram indicated by the arrow Q12 is an A-A' cross-sectional view of the wiring layer indicated by the arrow Q11, that is, a cross-sectional view of the wiring layer indicated by the arrow Q11 as viewed in the horizontal direction.

In the cross-sectional view indicated by the arrow Q12, a Si layer 122 in which the photodiodes are provided is provided on an upper side of wires 121 in the figure. Light from the subject passes through the Si layer 122 and the wiring layer, in which the wires 121 are provided, from the upper side in the figure and is reflected by another wiring layer (not shown) as reflected light. Then, the reflected light enters again the wiring layer, in which the wires 121 are provided, from the lower side in the figure.

In the cross-sectional view indicated by the arrow Q12, for example, straight lines L11 and L12 indicate reflected light beams returned from the other wiring layer to the wires 121. In this example, each of the reflected light beams indicated by the straight lines L11 and L12 is diffracted, between the wires 121 arranged adjacent to each other, in the direction in which the wires 121 are arranged, that is, the short-side direction of the wire 121. Then, the diffracted reflected light beams interfere with each other in the Si layer 122 in which the photodiodes are provided.

As a result, the light beams undergo constructive and destructive interference in some regions of the Si layer 122. Thus, interference fringes are generated in the short-side direction of the wire 121. Ovals in the Si layer 122 that are indicated by arrows C11 and C12 indicate emission regions of zero-order interference light and first-order interference light in the interference fringes.

Figure 5:
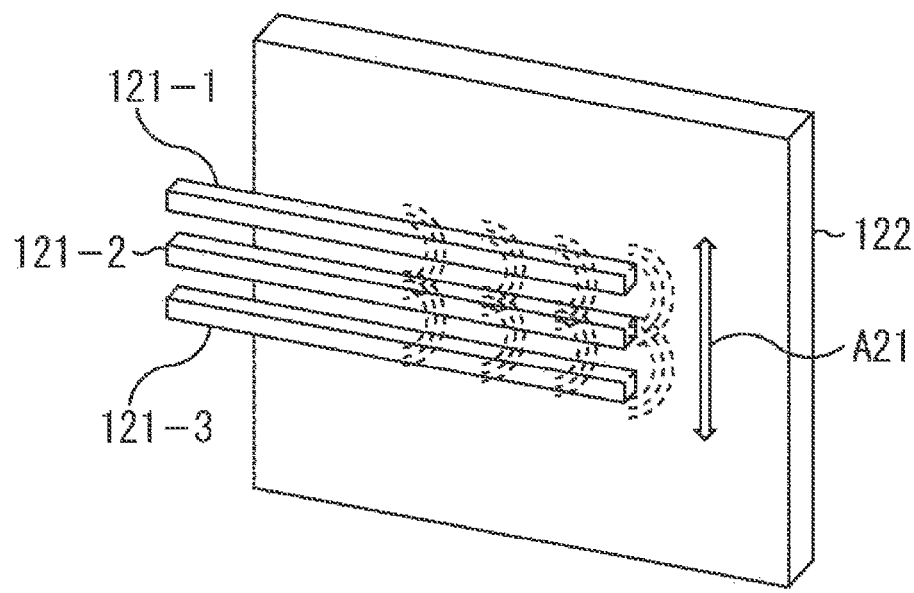
FIG. 5 is a view explaining diffraction and interference of the reflected light.

When such diffraction and interference of the reflected light are viewed in a direction perpendicular to a surface of the Si layer 122, the diffraction and interference are caused in a direction of an arrow A21 as shown in FIG. 5. Note that, in FIG. 5, portions corresponding to those in FIG. 4 are denoted by the same reference symbols and descriptions thereof will be appropriately omitted.

In FIG. 5, the wires 121 are provided on a front side of the Si layer 122 in the figure. The reflected light from the other wiring layer (not shown) travels from the front side to a deep side and enters the wiring layer of the wires 121. Then, the reflected light that has entered the wiring layer is diffracted between the wires 121 adjacent to each other in directions indicated by the arrow A21, the reflected and diffracted light beams interfere with each other, and the light beams mutually intensified due to the interference are spread in the directions of the arrow A21.

As described above, a dominant component of light that passes through the Si layer 122 and the wiring layer of the wires 121, is reflected by the other wiring layer, and is returned to the wiring layer of the wires 121 is the R component. Therefore, the description will be continued focusing on the R pixel.

Figure 6:
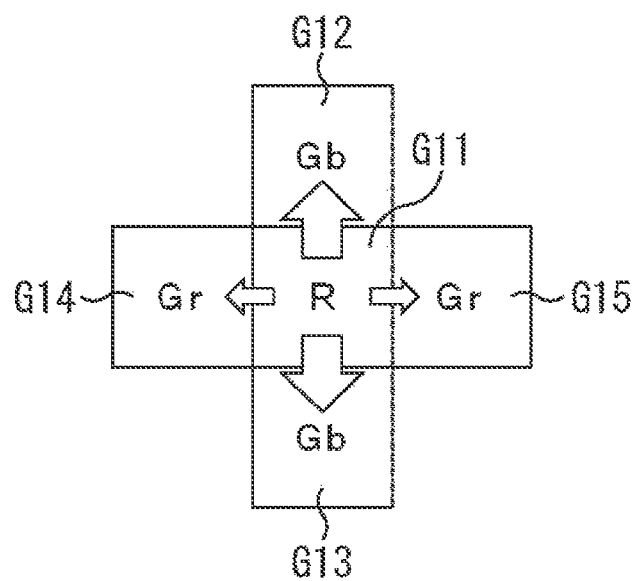
FIG. 6 is a view explaining diffraction directions of the reflected light and deterioration of the image quality due to interference.

For example, it is assumed that the pixel array section including the Si layer 122 includes pixels G11 to G15 as shown in FIG. 6. Note that it is assumed that the vertical direction in FIG. 6 is the direction of the arrow A21 in FIG. 5.

In this example, the pixel G11 is an R pixel. The pixels G12 and G13 adjacent to the pixel G11 in upper and lower directions in the figure are Gb pixels. The pixels G14 and G15 adjacent to the pixel G11 in left and right-hand directions in the figure are Gr pixels.

The pixel G11 being the R pixel is a pixel having a larger amount of light that enters from the subject, passes through the Si layer 122, and reaches the wiring layer of the wires 121 in comparison with other color pixels. Therefore, the diffraction and interference of light are easily caused in the wiring layer corresponding to the pixel G11 being the R pixel.

In this example, the light that enters the pixel G11 from the subject, passes through the Si layer 122 and the wiring layer of the wires 121, and is reflected by the other wiring layer is diffracted in the vertical direction in FIG. 6, that is, the direction of the arrow A21 in FIG. 5 in the wiring layer of the wires 121 when the light enters again the wiring layer of the wires 121. Therefore, as described with reference to FIG. 5, the light beams enter the wiring layer of the wires 121 from the other wiring layer, are mutually intensified due to the interference, and are spread in the vertical direction in FIG. 6.

Thus, larger part of the reflected light returned from the other wiring layer to the Si layer 122 enters the pixel G11 and the pixels G12 and G13 adjacent to the pixel G11 in the vertical direction in the figure. Smaller part of the reflected light enters the pixels G14 and G15 in comparison with the pixels G12 and G13.

Thus, a difference between a value of pixel signals output from the pixels G12 and G13 being the Gb pixels and a value of pixel signals output from the pixels G14 and G15 being the Gr pixels, that is an output difference between the pixels increases. As a result, lateral fringes and the like are generated in the resulting image due to the difference in output between the pixels, which deteriorates the image quality.

As described above, in the solid-state imaging element in the related art, the diffraction and interference of the light that has entered again the Si layer are caused particularly in one direction in some wiring patterns in the wiring layer. Thus, it is difficult to provide a high-quality image.

In view of this, in the solid-state imaging element 11 to which the present disclosure is applied, a wire extending long in one direction in the wiring layer 72 situated relatively far from the Si layer 53 is provided with protrusions. The protrusions protrude in a direction different from a direction in which the wire extends. The protrusions overcome the phenomenon that the reflected light from the wiring layer 73 undergoes diffraction and interference also in a direction different from the long-side direction of the wire and the diffraction and interference are caused particularly only in one direction. Thus, it is possible to provide a higher-quality image.

Figure 7:
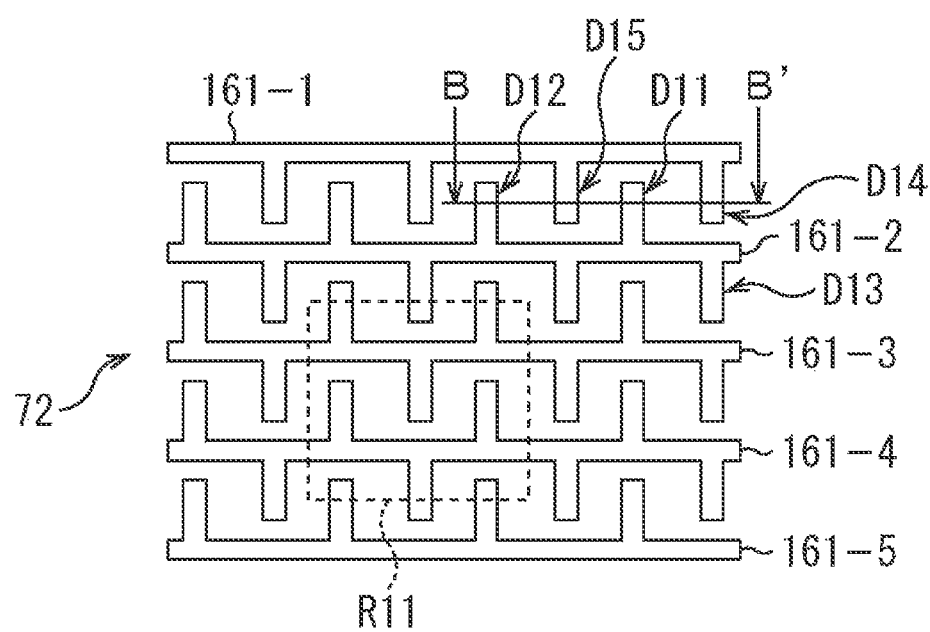
FIG. 7 is a view showing an example of a wiring pattern of a wiring layer.

Specifically, wires are provided in the wiring layer 72 in a wiring pattern shown in FIG. 7, for example. Note that FIG. 7 is a view as the wiring layer 72 shown in FIG. 2 is viewed downwards in FIG. 2, that is, in a direction perpendicular to the light reception surface of the pixel array section 21.

In FIG. 7, a plurality of wires 161-1 to 161-5 having a comb-tooth shape are provided in the wiring layer 72. Note that, hereinafter, the wires 161-1 to 161-5 will be simply referred to as wires 161 if it is unnecessary to differentiate them from one another.

Each of the wires 161 has a shape long in the horizontal direction in the figure. The wire 161 is provided with protrusions protruding in the vertical direction in the figure. Note that, hereinafter, the direction in which the wires 161 extend long, that is, the horizontal direction in the figure will be also referred to as a long-side direction of the wire 161. Further, the direction perpendicular to the long-side direction, that is, the vertical direction in the figure will be also referred to as a short-side direction of the wire 161.

For example, a wire 161-2 is provided with a plurality of additional wires protruding in the upper direction in the figure, which include additional wires indicated by arrows D11 and D12, and with a plurality of additional wires protruding in the lower direction in the figure, which include an additional wire indicated by an arrow D13, as protrusions of the wires 161. In particular, in this example, the wire 161 is provided with the additional wires protruding in the upper direction in the figure and the additional wires protruding in the lower direction in the figure, which are alternately arranged in the long-side direction of the wire 161. Further, for example, the wire 161-1 is also provided with a plurality of additional wires protruding in the lower direction in the figure, which include additional wires indicated by arrows D14 and D15, as the protrusions of the wires 161.

The additional wire indicated by the arrow D11 extends toward the wire 161-1 adjacent to the wire 161-2 by such a distance that the additional wire does not cause a short-circuit with the wire 161-1. Further, each wire 161 is provided with additional wires protruding toward the wires 161 adjacent to that wire 161 like branches, which are arranged at equal intervals such that the additional wires of that wire 161 alternate with additional wires of these adjacent wires 161.

For example, the wires 161-1 and 161-2 are provided with additional wires respectively indicated by the arrows D14, D11, D15, and D12 in order.

Further, in the wiring layer 72, the wires 161 long in one direction are arranged at equal intervals in the short-side direction of the wire 161.

In addition, in FIG. 7, a dotted line square region R11 indicates a region of the wiring layer 72, which overlaps with a region of one pixel constituting the pixel array section 21, in other words, a region of one photodiode 61 as viewed in the direction perpendicular to the light reception surface of the pixel array section 21. As can be seen from the figure, in the wiring layer 72, the wires 161 are arranged in a wiring pattern in which two wires 161 and additional wires as the protrusions provided in the wires 161 are included in the region R11 overlapping with the region of the one pixel.

Figure 8:
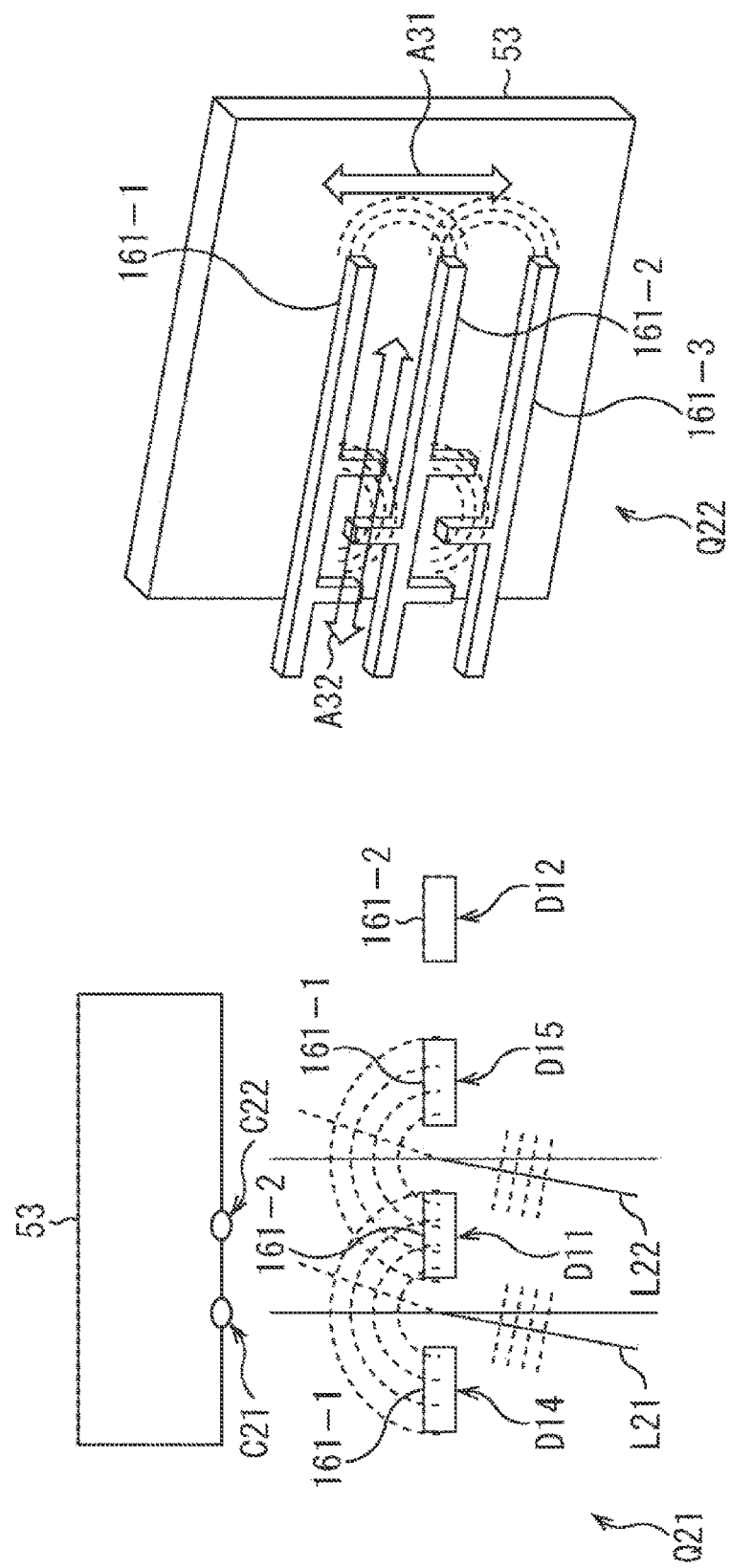
FIG. 8 is a view explaining diffraction and interference of reflected light.

By providing the wires 161 extending long in the one direction with the protrusions protruding in the short-side direction different from the long-side direction of the wire 161 in this manner, the diffraction and interference are caused in the wiring layer 72 not only in the short-side direction of the wire 161 but also in the long-side direction as shown in FIG. 8.

Note that portions of FIG. 8 that correspond to those in FIG. 2 or 7 are denoted by the same reference symbols and descriptions thereof will be appropriately omitted.

The diagram indicated by an arrow Q21 of FIG. 8 is a B-B' cross-sectional view of the wiring layer 72 shown in FIG. 7, that is, a view of a part of the pixel array section 21 as viewed in the same direction as in FIG. 2, for example. Thus, in this diagram, the horizontal direction in the figure is the long-side direction of the wire 161.

In the cross-sectional view indicated by the arrow Q21, the Si layer 53 is provided on an upper side of the wiring layer 72 in the figure, the wiring layer 72 including the wires 161. Light from the subject passes through the Si layer 53 and the wiring layer 72 from the upper side in the figure and is reflected by the wiring layer 73 (not shown) as reflected light. Then, the reflected light enters again the wiring layer 72 from the lower side in the figure.

For example, in the diagram indicated by the arrow Q21, straight lines L21 and L22 indicate reflected light beams that enter from the subject, pass through the Si layer 53 and the wiring layer 72, are reflected by the wiring layer 73, and are returned to the wiring layer 72. In this example, as indicated by dotted lines, the reflected light beams indicated by the straight lines L21 and L22 are diffracted, between the protrusions of the wires 161 arranged adjacent to each other, in the long-side direction of the wire 161, that is, the horizontal direction in the figure. Then, the diffracted reflected light beams undergo interference in the Si layer 53 in which the photodiodes 61 are provided.

As a result, the light beams undergo constructive and destructive interference in some regions of the Si layer 53. Thus, interference fringes are generated in the short-side direction of the wire 161. Ovals in the Si layer 53 that are indicated by arrows C21 and C22 indicate emission regions of zero-order interference light and first-order interference light in the interference fringes.

Further, in the wiring layer 72, the diffraction and interference are caused also in the short-side direction of the wire 161 as described with reference to FIG. 4.

Thus, as indicated by an arrow Q22, the diffraction and interference of the reflected light are caused in the wiring layer 72 in a plurality of different directions including a direction of an arrow A31 that is the short-side direction of the wire 161 and a direction of an arrow A32 that is the long-side direction perpendicular to the short-side direction of the wire 161.

Note that the diagram indicated by the arrow Q22 is an illumination of a part of the pixel array section 21 as viewed in the direction perpendicular to the light reception surface of the pixel array section 21.

In the diagram indicated by the arrow Q22, the wires 161 are arranged on a front side of the Si layer 53 in the figure and the reflected light from the wiring layer 73 (not shown) travels from the front side to a deep side and enters the wiring layer 72 in which the wires 161 are provided.

Then, the reflected light that has entered the wiring layer 72 passes between the wires 161 adjacent to each other, that is, through a slit formed by the wires 161 adjacent to each other. A diffraction phenomenon in which the reflected light goes around to the back side of the wires 161 is caused. A range in which the reflected light is emitted in the Si layer 53 is spread. In this example, the reflected light is diffracted not only in the direction indicated by the arrow A31 but also in the direction indicated by the arrow A32.

In addition, the reflected light beams spread due to the diffraction are mutually intensified due to interference with an optical path difference between the reflected light beams being displaced by an amount corresponding to the wavelength. Thus, interference fringes are generated. The light beams mutually intensified due to the interference are spread in the direction of the arrow A31 and in the direction of the arrow A32.

Thus, in the Si layer 53, the light returned by the wiring layer 73 after passing through the Si layer 53 once can be prevented from undergoing diffraction and interference particularly only in one direction.

In other words, due to the pixel array section 21, the light beams mutually intensified due to the diffraction and interference in the wiring layer 72 enter not only the photodiode 61 in a particular pixel of the pixel array section 21 but also the photodiodes 61 of the pixels surrounding the particular pixel, and hence interference fringes are reduced as a whole. With this, it is possible to suppress generation of interference fringes in an image captured by the solid-state imaging element 11, and hence to provide a higher-quality image.

In particular, in the pixel array section 21, the dominant component of the light that enters from the subject through the lens array 51, passes through the Si layer 53, is reflected by the wiring layer 73, and undergoes diffraction and interference in the wiring layer 72 is the R component.

Figure 9:
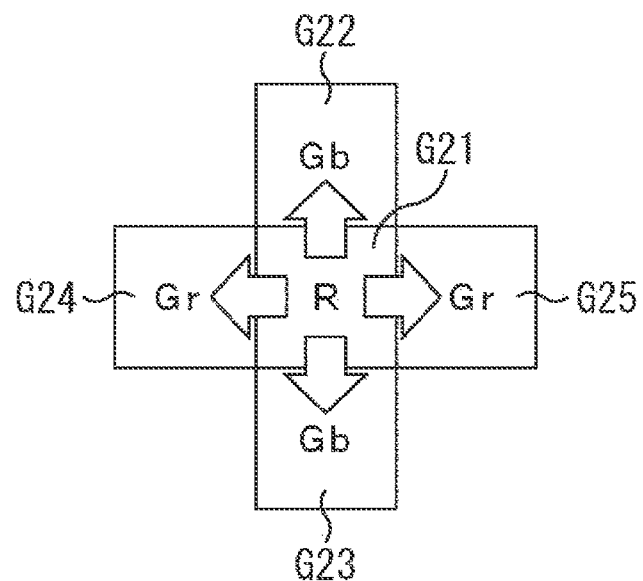
FIG. 9 is a view explaining diffraction directions of the reflected light and deterioration of the image quality due to interference.

Therefore, as shown in FIG. 9, the reflected light of light, which has entered the R pixel, can enter the R pixel and other pixels surrounding the R pixel.

Note that FIG. 9 shows pixels provided in the pixel array section 21, and pixels G21 to G25 are shown as pixels constituting the pixel array section 21 in this example. Further, the vertical direction and the horizontal direction in FIG. 9 are the short-side direction and the long-side direction of the wire 161.

In this example, the pixel G21 is an R pixel. Further, the pixels G22 and G23 adjacent to the pixel G21 in the upper and lower directions in the figure are Gb pixels. The pixels G24 and G25 adjacent to the pixel G21 in the left- and right-hand directions in the figure are Gr pixels.

The pixel G21 being the R pixel has a larger amount of light that enters from the subject, passes through the Si layer 53, and reaches the wiring layer 72 in comparison with other color pixels. Therefore, the diffraction and interference of light returned from the wiring layer 73 to the wiring layer 72 is easily caused in the pixel G21 being the R pixel.

In this example, the light that enters the Si layer 53 from the subject through the lens array 51 and the color filter 52 constituting the pixel G21, passes through the Si layer 53 and the wiring layer 72, and is reflected by the wiring layer 73 undergoes diffraction and interference in the wiring layer 72 when the light enters the wiring layer 72 again.

At this time, the directions of the diffraction and interference of the light are the long-side direction and the short-side direction of the wire 161 as described with reference to FIG. 8. Therefore, light beams enter the wiring layer 72 from the wiring layer 73 and are diffracted, mutually intensified due to interference, and spread in the vertical direction and the horizontal direction in FIG. 9.

Thus, the reflected light returned from the wiring layer 73 to the Si layer 53 enters not only the pixel G21 and the pixels G22 and G23 adjacent to the pixel G21 in the vertical direction in the figure but also the pixels G24 and G25 adjacent to the pixel G21 in the horizontal direction in the figure.

With this, the diffraction and interference of the reflected light can be dispersed in multiple directions.

Thus, a difference between a value of the pixel signals output from the pixels G22 and G23 being the Gb pixels and a value of the pixel signals output from the pixels G24 and G25 being the Gr pixels, that is, an output difference between the pixels can be reduced. As a result, it is possible to suppress generation of lateral fringes and the like due to the output difference between the pixels in the resulting image and thus to improve the image quality.

In addition, in the wiring layer 72 of the wiring layer 54, which is provided with respect to the Si layer 53 sandwiching the wiring layer 71 therebetween and situated at a position relatively far from the Si layer 53, the wires 161 are provided with protrusions. Thus, the wires 161 situated at a position far from the gates of the amplifying transistors of the pixels and the control wires of the floating diffusion region can control the direction of the diffraction and interference of the reflected light.

Thus, even if the protrusions are added to the wires 161, a coupling capacitance with the gates of the amplifying transistors of the pixels and the control wires of the floating diffusion region do not significantly increase, and hence it is possible to suppress a reduction in efficiency of converting electrons into a voltage in the amplifying transistor. Thus, it is possible to improve the SN ratio, and hence to provide a high-quality image.

Note that, although the example in which the wiring pattern of the wiring layer 72 is set such that the diffraction and interference of light are caused in the plurality of directions has been described, a wiring pattern of another wiring layer such as the wiring layer 71 may be set such that the diffraction and interference of the light are caused in the plurality of directions. Alternatively, wiring patterns of a plurality of wiring layers may be set such that the diffraction and interference of the light are caused in the plurality of directions.

<Second Embodiment>
<Example of Wiring Pattern>

Note that, although the wiring pattern of the wiring layer 72 is set to the pattern shown in FIG. 7, the wiring pattern of the wiring layer 72 may be any pattern as long as light that has entered from the wiring layer 73 undergoes diffraction and interference in a plurality of directions.

Figure 10:
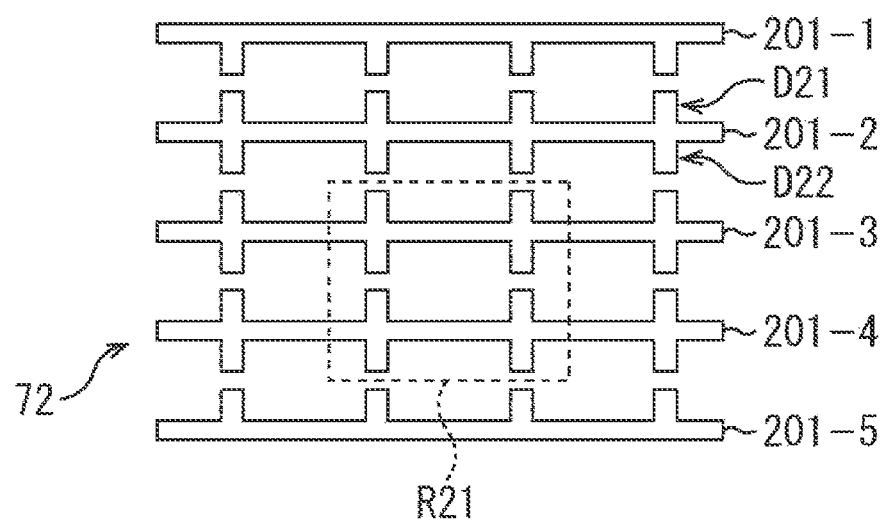
FIG. 10 is a view showing another example of the wiring pattern of the wiring layer.

Specifically, the wiring pattern of the wiring layer 72 may be set to the wiring pattern shown in FIG. 10, for example. Note that FIG. 10 is a view of the wiring layer 72 shown in FIG. 2 as viewed downwards in FIG. 2, that is, the direction perpendicular to the light reception surface of the pixel array section 21.

In FIG. 10, a plurality of wires 201-1 to 201-5 having a comb-tooth shape are provided in the wiring layer 72. Note that, hereinafter, the wires 201-1 to 201-5 will be simply referred to as wires 201 if it is unnecessary to differentiate them from one another.

Each of the wires 201 has a shape long in the horizontal direction in the figure. The wire 201 is provided with protrusions protruding in the vertical direction in the figure. Note that, hereinafter, the direction in which the wires 201 extend long, that is, the horizontal direction in the figure will be also referred to as a long-side direction of the wire 201. Further, the direction perpendicular to the long-side direction, that is, the vertical direction in the figure will be also referred to as a short-side direction of the wire 201.

For example, a wire 201-2 is provided with a plurality of additional wires protruding in the upper direction in the figure, which include an additional wire indicated by an arrow D21, and with a plurality of additional wires protruding in the lower direction in the figure, which include an additional wire indicated by an arrow D22, as protrusions of the wires 201.

The additional wire indicated by the arrow D21 extends toward the wire 201-1 adjacent to the wire 201-2 by such a distance that the additional wire does not cause a short-circuit with the additional wire as the protrusion provided to be opposed to the wire 201-1. Further, each wire 201 is provided with additional wires protruding toward the wires 201 adjacent to that wire 201 like branches, which are arranged at equal intervals such that the additional wires of that wire 201 are opposed to additional wires of these adjacent wires 201. In addition, each wire 201 is provided with the additional wires protruding in the upper direction in the figure and the additional wires protruding in the lower direction in the figure, which are arranged at the same positions in the long-side direction of the wire 201.

Further, in the wiring layer 72, the wires 201 long in one direction are arranged at equal intervals in the short-side direction of the wire 201.

In addition, in FIG. 10, a dotted line square region R21 indicates a region of the wiring layer 72, which overlaps with a region of one pixel constituting the pixel array section 21, in other words, a region of one photodiode 61 as viewed in a direction perpendicular to the light reception surface of the pixel array section 21. As can be seen from the figure, in the wiring layer 72, the wires 201 are arranged in a wiring pattern in which two wires 201 and additional wires as the protrusions provided in the wires 201 are included in the region R21 overlapping with the region of the one pixel.

By providing the wires 201 extending long in the one direction with the protrusions protruding in the short-side direction different from the long-side direction of the wire 201 in this manner, the diffraction and interference are caused in the wiring layer 72 not only in the short-side direction of the wire 201 but also in the long-side direction. Thus, it is possible to provide a high-quality image.

<Third Embodiment>
<Example of Wiring Pattern>

Figure 11:
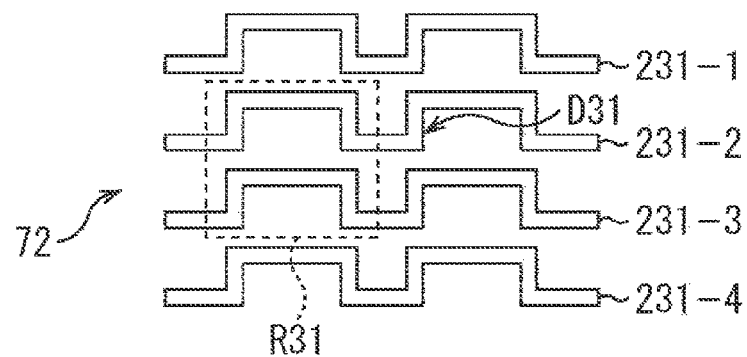
FIG. 11 is a view showing another example of the wiring pattern of the wiring layer.

Alternatively, the wiring pattern of the wiring layer 72 may be set to a wiring pattern shown in FIG. 11, for example. Note that FIG. 11 is a view of the wiring layer 72 shown in FIG. 2 as viewed downwards in FIG. 2, that is, the direction perpendicular to the light reception surface of the pixel array section 21.

In FIG. 11, a plurality of wires 231-1 to 231-4 are provided in the wiring layer 72. Note that, hereinafter, the wires 231-1 to 231-4 will be simply referred to as wires 231 if it is unnecessary to differentiate them from one another.

Each of the wires 231 has a shape long in the horizontal direction in the figure. The wire 231 is provided with protrusions protruding in the vertical direction in the figure. Note that, hereinafter, the direction in which the wires 231 extend long, that is, the horizontal direction in the figure will be also referred to as a long-side direction of the wire 231. Further, the direction perpendicular to the long-side direction, that is, the vertical direction in the figure will be also referred to as a short-side direction of the wire 231.

By changing the extending direction of some parts of each of the wires 231, protrusions protruding toward other wires 231 adjacent to that wire 231 are formed.

For example, a wire 231-2 is provided with a plurality of rectangular protrusions protruding in the lower direction in the figure, which includes a protrusion indicated by an arrow D31. This rectangular protrusion is formed in the following manner. Specifically, a part of the wire 231 is bent in the lower direction in the figure, which is perpendicular to the long-side direction. Then, the part of the wire 231 is bent in the long-side direction. Then, the part of the wire 231 is bent in the upper direction in the figure, which is perpendicular to the long-side direction. Thus, the part of the wire 231 is protruded in the short-side direction.

The protrusion indicated by the arrow D31 protrudes toward a wire 231-3 adjacent to the wire 231-2 and is provided to be opposed to the protrusion of the wire 231-3. Further, each wire 231 is provided with protrusions protruding toward the wires 231 adjacent to each other. The protrusions are arranged at equal intervals. The protrusions of the wires 231 are provided at the same positions in the horizontal direction in the figure.

In addition, in the wiring layer 72, the wires 231 long in one direction are arranged at equal intervals in the short-side direction of the wire 231.

In addition, in FIG. 11, a dotted line square region R31 indicates a region of the wiring layer 72, which overlaps with a region of one pixel constituting the pixel array section 21, in other words, a region of one photodiode 61 as viewed in a direction perpendicular to the light reception surface of the pixel array section 21. As can be seen from the figure, in the wiring layer 72, the wires 231 are arranged in a wiring pattern in which two wires 231 and partial additional wires as the protrusions provided in the wires 231 are included in the region R31 overlapping with the region of the one pixel.

By providing the wires 231 extending long in the one direction with the protrusions protruding in the short-side direction different from the long-side direction of the wire 231 in this manner, the diffraction and interference are caused in the wiring layer 72 not only in the short-side direction of the wire 231 but also in the long-side direction. Thus, it is possible to provide a high-quality image.

<Fourth Embodiment>
<Example of Wiring Pattern>

Figure 12:
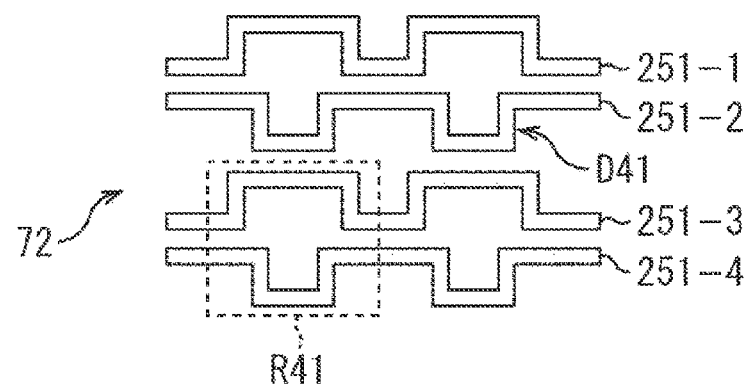
FIG. 12 is a view showing another example of the wiring pattern of the wiring layer.

Alternatively, the wiring pattern of the wiring layer 72 may be set to a wiring pattern shown in FIG. 12, for example. Note that FIG. 12 is a view of the wiring layer 72 shown in FIG. 2 as viewed downwards in FIG. 2, that is, the direction perpendicular to the light reception surface of the pixel array section 21.

In FIG. 12, a plurality of wires 251-1 to 251-4 having a comb-tooth shape are provided in the wiring layer 72. Note that, hereinafter, the wires 251-1 to 251-4 will be simply referred to as wires 251 if it is unnecessary to differentiate them from one another.

Each of the wires 251 has a shape long in the horizontal direction in the figure. The wire 251 is provided with protrusions protruding in the vertical direction in the figure. Note that, hereinafter, the direction in which the wires 251 extend long, that is, the horizontal direction in the figure will be also referred to as a long-side direction of the wire 251. Further, the direction perpendicular to the long-side direction, that is, the vertical direction in the figure will be also referred to as a short-side direction of the wire 251.

By changing the extending direction of some parts of each of the wires 251, protrusions protruding toward other wires 251 adjacent to that wire 251 are formed.

For example, a wire 251-2 is provided with a plurality of rectangular protrusions protruding in the lower direction in the figure, which includes a protrusion indicated by an arrow D41. This rectangular protrusion is formed in the following manner. Specifically, a part of the wire 251 is bent in the lower direction in the figure, which is perpendicular to the long-side direction. Then, the part of the wire 251 is bent in the long-side direction. Then, the part of the wire 251 is bent in the upper direction in the figure, which is perpendicular to the long-side direction. Thus, the part of the wire 251 is protruded in the short-side direction.

The protrusion indicated by the arrow D41 protrudes toward a wire 251-3 adjacent to the wire 251-2 and is provided to be opposed to a non-protruding portion of the wire 251-3.

Further, each wire 251 is provided with protrusions protruding toward the wires 251 adjacent to each other. The protrusions are arranged at equal intervals. The protrusions of the wires 251 adjacent to each other are alternately arranged in the horizontal direction in the figure. In addition, in the wiring layer 72, wires 251 long in one direction are arranged at equal intervals in the short-side direction of the wire 251.

In short, the wiring pattern shown in FIG. 12 is a wiring pattern obtained by displacing the wires 231-2 and 231-4 by a predetermined distance in the horizontal direction in FIG. 11 in the wiring pattern shown in FIG. 11.

In addition, in FIG. 12, a dotted line square region R41 indicates a region of the wiring layer 72, which overlaps with a region of one pixel constituting the pixel array section 21, in other words, a region of one photodiode 61 as viewed in a direction perpendicular to the light reception surface of the pixel array section 21. As can be seen from the figure, in the wiring layer 72, the wires 251 are arranged in a wiring pattern in which two wires 251 and partial or entire additional wires as the protrusions provided in the wires 251 are included in the region R41 overlapping with the region of the one pixel.

By providing the wires 251 extending long in the one direction with the protrusions protruding in the short-side direction different from the long-side direction of the wire 251 in this manner, the diffraction and interference are caused in the wiring layer 72 not only in the short-side direction of the wire 251 but also in the long-side direction. Thus, it is possible to provide a high-quality image.

<Fifth Embodiment>
<Example of Wiring Pattern>

Figure 13:
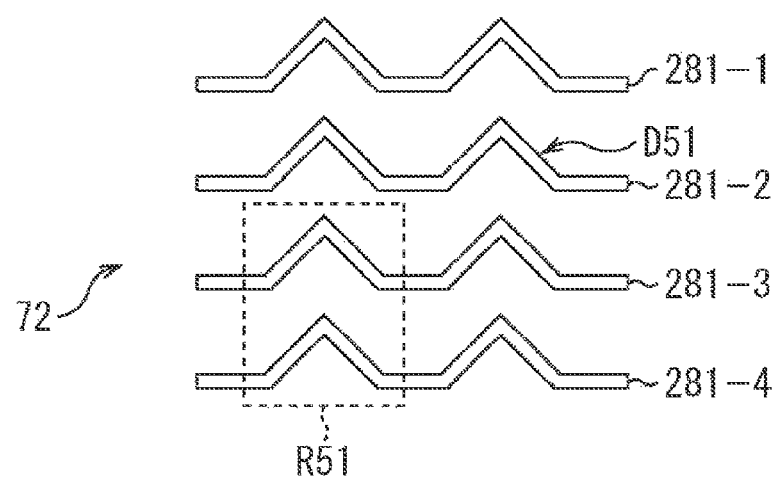
FIG. 13 is a view showing another example of the wiring pattern of the wiring layer.

Alternatively, the wiring pattern of the wiring layer 72 may be set to a wiring pattern shown in FIG. 13, for example. Note that FIG. 13 is a view of the wiring layer 72 shown in FIG. 2 as viewed downwards in FIG. 2, that is, the direction perpendicular to the light reception surface of the pixel array section 21.

In FIG. 13, a plurality of wires 281-1 to 281-4 are provided in the wiring layer 72. Note that, hereinafter, the wires 281-1 to 281-4 will be simply referred to as wires 281 if it is unnecessary to differentiate them from one another.

Each of the wires 281 has a shape long in the horizontal direction in the figure. The wire 281 is provided with protrusions protruding in the vertical direction in the figure. Note that, hereinafter, the direction in which the wires 281 extend long, that is, the horizontal direction in the figure will be also referred to as a long-side direction of the wire 281. Further, the direction perpendicular to the long-side direction, that is, the vertical direction in the figure will be also referred to as a short-side direction of the wire 281.

By changing the extending direction of some parts of each of the wires 281, protrusions protruding toward other wires 281 adjacent to that wire 281 are formed.

For example, a wire 281-2 is provided with a plurality of triangular protrusions protruding in the upper direction in the figure, which includes a protrusion indicated by an arrow D51. This triangular protrusion is formed in the following manner. Specifically, a part of the wire 281 is bent obliquely to the long-side direction. Thus, the part of the wire 281 is protruded in a mountain shape in the short-side direction.

The protrusion indicated by an arrow D51 protrudes toward a wire 281-1 adjacent to the wire 281-2 and is provided to be opposed to the protrusion of the wire 281-1. Further, each wire 281 is provided with protrusions protruding toward the wires 281 adjacent to each other. The protrusions are arranged at equal intervals. The protrusions of each wire 281 are provided at the same positions in the horizontal direction in the figure.

In addition, in the wiring layer 72, wires 281 long in one direction are arranged at equal intervals in the short-side direction of the wire 281.

In addition, in FIG. 13, a dotted line square region R51 indicates a region of the wiring layer 72, which overlaps with a region of one pixel constituting the pixel array section 21, in other words, a region of one photodiode 61 as viewed in a direction perpendicular to the light reception surface of the pixel array section 21. As can be seen from the figure, in the wiring layer 72, the wires 281 are arranged in a wiring pattern in which two wires 281 and additional wires as the protrusions provided in the wires 281 are included in the region R51 overlapping with the region of the one pixel.

By providing the wires 281 extending long in the one direction with the protrusions protruding in the short-side direction different from the long-side direction of the wire 281 in this manner, the diffraction and interference are caused in the wiring layer 72 not only in the short-side direction of the wire 281 but also in a direction different from the short-side direction. Thus, it is possible to provide a high-quality image.

<Sixth Embodiment>
<Example of Wiring Pattern>

Figure 14:
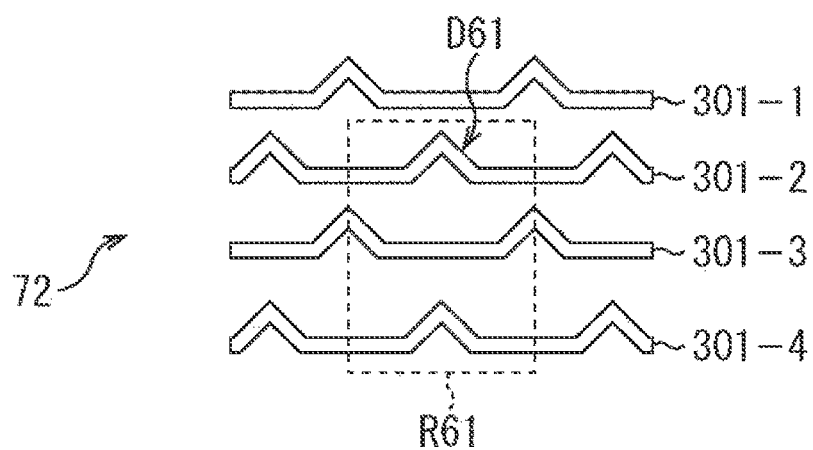
FIG. 14 is a view showing another example of the wiring pattern of the wiring layer.

Alternatively, the wiring pattern of the wiring layer 72 may be set to a wiring pattern shown in FIG. 14, for example. Note that FIG. 14 is a view of the wiring layer 72 shown in FIG. 2 as viewed downwards in FIG. 2, that is, the direction perpendicular to the light reception surface of the pixel array section 21.

In FIG. 14, a plurality of wires 301-1 to 301-4 are provided in the wiring layer 72. Note that, hereinafter, the wires 301-1 to 301-4 will be simply referred to as wires 301 if it is unnecessary to differentiate them from one another.

Each of the wires 301 has a shape long in the horizontal direction in the figure. The wire 301 is provided with protrusions protruding in the vertical direction in the figure. Note that, hereinafter, the direction in which the wires 301 extend long, that is, the horizontal direction in the figure will be also referred to as a long-side direction of the wire 301. Further, the direction perpendicular to the long-side direction, that is, the vertical direction in the figure will be also referred to as a short-side direction of the wire 301.

By changing the extending direction of some parts of each of the wires 301, protrusions protruding toward other wires 301 adjacent to that wire 301 are formed.

For example, a wire 301-2 is provided with a plurality of triangular protrusions protruding in the upper direction in the figure, which includes a protrusion indicated by an arrow D61. This triangular protrusion is formed in the following manner. Specifically, a part of the wire 301 is bent obliquely to the long-side direction. Thus, the part of the wire 301 is protruded in a mountain shape in the short-side direction.

The protrusion indicated by the arrow D61 protrudes toward a wire 301-1 adjacent to the wire 301-2 and is provided to be opposed to a non-protruding portion of the wire 301-1.

Further, each wire 301 is provided with protrusions protruding toward the wires 301 adjacent to each other. The protrusions are arranged at equal intervals. The protrusions of the wires 301 adjacent to each other are alternately arranged in the horizontal direction in the figure. In addition, in the wiring layer 72, wires 301 long in one direction are arranged at equal intervals in the short-side direction of the wire 301.

In short, the wiring pattern shown in FIG. 14 is a wiring pattern obtained by displacing the wires 281-2 and 281-4 by a predetermined distance in the horizontal direction in FIG. 13 in the wiring pattern shown in FIG. 13.

In addition, in FIG. 14, a dotted line square region R61 indicates a region of the wiring layer 72, which overlaps with a region of one pixel constituting the pixel array section 21, in other words, a region of one photodiode 61 as viewed in a direction perpendicular to the light reception surface of the pixel array section 21. As can be seen from the figure, in the wiring layer 72, the wires 301 are arranged in a wiring pattern in which three wires 301 and partial or entire additional wires as the protrusions provided in the wires 301 are included in the region R61 overlapping with the region of the one pixel.

By providing the wires 301 extending long in the one direction with the protrusions protruding in the short-side direction different from the long-side direction of the wire 301 in this manner, the diffraction and interference are caused in the wiring layer 72 not only in the short-side direction of the wire 301 but also in a direction different from the short-side direction. Thus, it is possible to provide a high-quality image.

<Configuration Example of Imaging Apparatus>

In addition, the present disclosure is applicable to general electronic apparatuses each using a solid-state imaging element in a photoelectric conversion section, such as an imaging apparatus including a digital still camera, a video camera, and the like, a portable terminal apparatus with an imaging function, and a copy machine using a solid-state imaging element in an image reading section. The solid-state imaging element may take a form as a one chip. Alternatively, the solid-state imaging element may take a module form with an imaging function, packing an imaging section and a signal processor or an optical system together.

Figure 15:
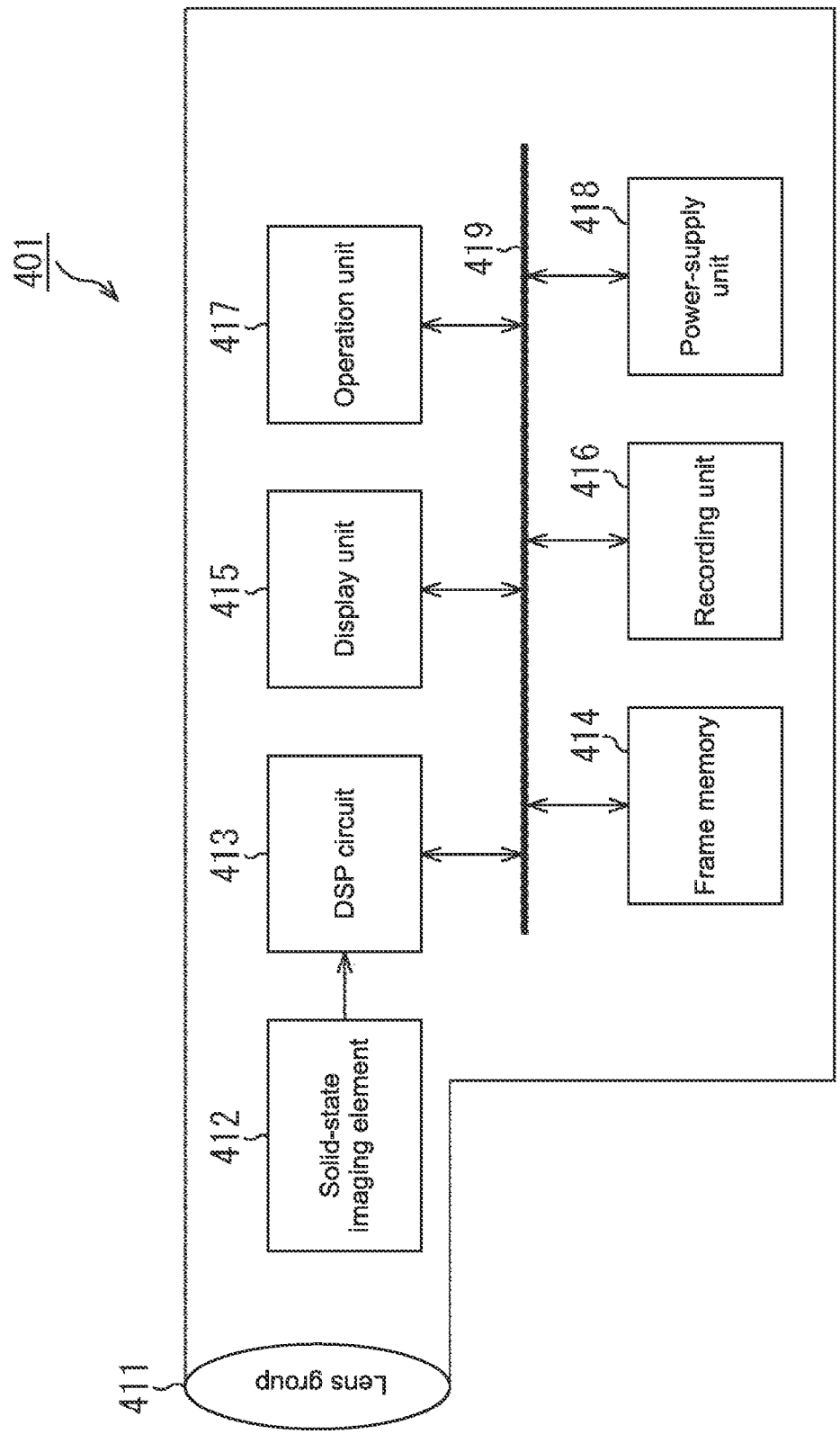
FIG. 15 is a view showing a configuration example of an imaging apparatus.

FIG. 15 is a view showing a configuration example of an imaging apparatus as an electronic apparatus to which the present disclosure is applied.

An imaging apparatus 401 in FIG. 15 includes an optical unit 411 constituted of a lens group and the like, a solid-state imaging element (imaging device) 412, and a digital signal processor (DSP) circuit 413 being a camera signal processing circuit. The imaging apparatus 401 further includes a frame memory 414, a display unit 415, a recording unit 416, an operation unit 417, and a power-supply unit 418. The DSP circuit 413, the frame memory 414, the display unit 415, the recording unit 416, the operation unit 417, and the power-supply unit 418 are connected to one another via a bus line 419.

The optical unit 411 captures incident light (image light) from a subject and forms an image from the incident light on an imaging surface of the solid-state imaging element 412. The solid-state imaging element 412 converts an amount of incident light focused on the imaging surface by the optical unit 411 into an electrical signal per pixel and outputs the converted signal as a pixel signal. This solid-state imaging element 412 corresponds to the above-mentioned solid-state imaging element 11.

The display unit 415 is constituted of, for example, a panel type display apparatus such as a liquid-crystal panel and an organic electro luminescence (EL) panel. The display unit 415 displays a moving image or still image captured by the solid-state imaging element 412. The recording unit 416 records the moving image or still image captured by the solid-state imaging element 412 on a recording medium such as a video tape and a digital versatile disk (DVD).

The operation unit 417 issues operation instructions about various functions of the imaging apparatus 401 according to operations made by the user. The power-supply unit 418 appropriately supplies various types of power as power sources to the DSP circuit 413, the frame memory 414, the display unit 415, the recording unit 416, and the operation unit 417 as supply targets.

Note that, in each of the above-mentioned embodiments, the present disclosure is applied to the CMOS image sensor in which pixels that detect signal charges based on light amounts of visible light as physical amounts are arranged in a matrix form as an example. However, the present disclosure is not limited to be applied to the CMOS image sensor and is applicable to general solid-state imaging elements.

Embodiments of the present disclosure are not limited to the above-mentioned embodiments and may be variously changed without departing from the gist of the present disclosure.

Note that the present disclosure may also take the following configurations.

[1] An imaging element, including:
  a photoelectric conversion section configured to photoelectrically convert light incident from a subject; and
  a wiring layer that is provided on an opposite side of the subject with respect to the photoelectric conversion section and includes a wire connected to an element that constitutes a pixel including the photoelectric conversion section, the wire including a plurality of wires extending long in a predetermined direction, the plurality of wires being arranged in a direction almost perpendicular to the predetermined direction in the wiring layer, the wire being provided with a protrusion protruding in a direction different from the predetermined direction.

[2] The imaging element according to [1], in which
  the protrusion of the wire includes a plurality of protrusions.

[3] The imaging element according to [1] or [2], in which
  the protrusion is an additional wire added to the wire to protrude toward another wire adjacent to the wire.

[4] The imaging element according to [3], in which
  the wire is provided with
    the additional wire protruding toward the other wire adjacent in a first direction of the wire, and
    the additional wire protruding toward the other wire adjacent in a second direction opposite to the first direction of the wire.

[5] The imaging element according to [4], in which
  the wire is provided with
    the additional wire protruding toward the other wire adjacent in the first direction, and
    the additional wire protruding toward the other wire adjacent in the second direction, the additional wires being alternately arranged in the predetermined direction.

[6] The imaging element according to [4], in which
  the wire is provided with
    the additional wire protruding toward the other wire adjacent in the first direction, and
    the additional wire protruding toward the other wire adjacent in the second direction, the additional wires being provided at the same position in the predetermined direction.

[7] The imaging element according to [1] or [2], in which
  the protrusion is formed by changing an extending direction of a part of the wire such that the part of the wire protrudes toward the other wire adjacent to the wire.

[8] The imaging element according to [7], in which
  the protrusion has one of a rectangular shape and a triangle shape.

[9] The imaging element according to [7] or [8], in which
  the protrusions of the wires are provided at the same position in the predetermined direction.

[10] The imaging element according to [7] or [8], in which
  the protrusions of the wires adjacent to each other are provided at different positions in the predetermined direction.

[11] The imaging element according to any one of [1] to [10], in which
  the imaging element includes a pixel in a predetermined color having a highest transmittance of the light and pixels in a color different from the predetermined color, the pixels being arranged on upper, lower, left, and right sides of the pixel.

[12] The imaging element according to any one of [1] to [11], in which
  as the wiring layer is viewed in a direction perpendicular to a light reception surface of the imaging element, the plurality of wires and one of the entire protrusion of the wire and a part of the protrusion are included in a region of the wiring layer, the region overlapping with the photoelectric conversion section in the pixel.

[13] An electronic apparatus, including
an imaging element, including
a photoelectric conversion section configured to photoelectrically convert light incident from a subject, and
a wiring layer that is provided on an opposite side of the subject with respect to the photoelectric conversion section and includes a wire connected to an element that constitutes a pixel including the photoelectric conversion section, the wire including a plurality of wires extending long in a predetermined direction, the plurality of wires being arranged in a direction almost perpendicular to the predetermined direction in the wiring layer, the wire being provided with a protrusion protruding in a direction different from the predetermined direction.

[14] The electronic apparatus according to [13], in which the protrusion of the wire includes a plurality of protrusions.

[15] The electronic apparatus according to [13] or [14], in which
the protrusion is an additional wire added to the wire to protrude toward another wire adjacent to the wire.

[16] The electronic apparatus according to [15], in which
the wire is provided with
the additional wire protruding toward the other wire adjacent in a first direction of the wire, and
the additional wire protruding toward the other wire adjacent in a second direction opposite to the first direction of the wire.

[17] The electronic apparatus according to [13] or [14], in which
the protrusion is formed by changing an extending direction of a part of the wire such that the part of the wire protrudes toward the other wire adjacent to the wire.

[18] The electronic apparatus according to [17], in which
the protrusion has one of a rectangular shape and a triangle shape.

[19] The electronic apparatus according to any one of [13] to [18], in which
the imaging element includes a pixel in a predetermined color having a highest transmittance of the light and pixels in a color different from the predetermined color, the pixels being arranged on upper, lower, left, and right sides of the pixel.

[20] The electronic apparatus according to any one of [13] to [19], in which
as the wiring layer is viewed in a direction perpendicular to a light reception surface of the imaging element, the plurality of wires and one of the entire protrusion of the wire and a part of the protrusion are included in a region of the wiring layer, the region overlapping with the photoelectric conversion section in the pixel.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging element, comprising:
a photoelectric conversion section configured to photoelectrically convert light incident from a subject; and
a wiring layer that is provided on a side of the photoelectric conversion section opposite the subject and includes a plurality of wires extending long in a predetermined direction and coupled to an element that constitutes a pixel including the photoelectric conversion section, the plurality of wires being arranged parallel to one another in a direction substantially perpendicular to the predetermined direction in the wiring layer, each of the plurality of wires being provided with a plurality of protrusions,
wherein each protrusion protrudes in a direction that is perpendicular to the predetermined direction,
wherein at least one wire of the plurality of wires has at least a first protrusion and a second protrusion in a region corresponding to one pixel in a plan view,
wherein the first protrusion is disposed at a first side of the at least one wire in the plan view, and
wherein the second protrusion is disposed at a second side of the at least one wire in the plan view.

2. The imaging element according to claim 1, wherein the plurality of protrusions are additional wires in the form of stubs that extend from each of the plurality of wires to protrude toward another of the plurality of wires.

3. The imaging element according to claim 2, wherein the plurality of protrusions are alternately arranged in the predetermined direction such that the protrusions of adjacent wires are at alternate locations along the predetermined direction.

4. The imaging element according to claim 2, wherein the plurality of protrusions are arranged for adjacent wires such that the protrusions of a first one of the adjacent wires are opposite the protrusions of a second one of the adjacent wires.

5. The imaging element according to claim 2, wherein the plurality of protrusions of adjacent wires are interleaved with one another.

6. The imaging element according to claim 1, wherein the plurality of protrusions each have a rectangular shape.

7. The imaging element according to claim 6, wherein each protrusion of a first one of the plurality of wires is opposite a protrusion of a second one of the plurality of wires.

8. The imaging element according to claim 6, wherein the protrusions of a first one of the plurality of wires is adjacent the protrusions of a second one of the plurality of wires.

9. The imaging element according to claim 1, wherein the imaging element includes a pixel in a predetermined color having a highest transmittance of the light and pixels in a color different from the predetermined color, the pixels having a color different from the predetermined color being arranged on upper, lower, left, and right sides of the pixel.

10. The imaging element according to claim 1, wherein as the wiring layer is viewed in a direction perpendicular to a light reception surface of the imaging element, the plurality of wires and one of an entire protrusion and a part of the protrusion are included in a region of the wiring layer, the region overlapping with an entirety of the photoelectric conversion section in the pixel.

11. An electronic apparatus, comprising:
an imaging element, including:
a photoelectric conversion section configured to photoelectrically convert light incident from a subject, and
a wiring layer that is provided on a side of the photoelectric conversion section opposite the subject and includes a plurality of wires extending long in a predetermined direction and coupled to an element that constitutes a pixel including the photoelectric conversion section, the plurality of wires being arranged parallel to one another in a direction substantially perpendicular to the predetermined direction in the wiring layer, each of the plurality of wires being provided with a plurality of protrusions, wherein each protrusion protrudes in a direction perpendicular to the predetermined direction, wherein at least one wire of the plurality of wires has at least a first protrusion and a second protrusion in a region corresponding to one pixel in a plan view, wherein the first protrusion is disposed at a first side of the wire in the plan view, and wherein the second protrusion is disposed at a second side opposite to the first side of the wire in the plan view.

12. The electronic apparatus according to claim 11, wherein at least some of the wires in the plurality of wires include a first plurality of protrusions that extend in a first direction that is perpendicular to the predetermined direction and a second plurality of protrusions that extend in a second direction that is perpendicular to the predetermined direction.

13. The electronic apparatus according to claim 11, wherein the plurality of protrusions are additional wires in the form of stubs that extend from each of the plurality of wires to protrude toward another of the plurality of wires.

14. The electronic apparatus according to claim 13, wherein each protrusion is formed by extending a part of each of the plurality of wires such that the part of each of the plurality of wires protrudes toward another of the plurality of wires.

15. The electronic apparatus according to claim 14, wherein each protrusion has a rectangular shape.

16. The electronic apparatus according to claim 11, wherein the imaging element includes a pixel in a predetermined color having a highest transmittance of the light and pixels in a color different from the predetermined color, the pixels having a color different from the predetermined color being arranged on upper, lower, left, and right sides of the pixel.

17. The electronic apparatus according to claim 11, wherein as the wiring layer is viewed in a direction perpendicular to a light reception surface of the imaging element, the plurality of wires and one of an entire protrusion and a part of the protrusion are included in a region of the wiring layer, the region overlapping with an entirety of the photoelectric conversion section in the pixel.

18. The imaging element according to claim 1, wherein each protrusion includes sides that are perpendicular to the predetermined direction and an end that is parallel to the predetermined direction.

19. The electronic apparatus according to claim 11, wherein each protrusion includes sides that are perpendicular to the predetermined direction and an end that is parallel to the predetermined direction.

* * * * *